(12) United States Patent
Hagi et al.

(10) Patent No.: US 10,312,673 B2
(45) Date of Patent: Jun. 4, 2019

(54) SHIELD CONDUCTION PATH

(71) Applicants: SUMITOMO WIRING SYSTEMS, LTD., Yokkaichi-shi, Mie (JP); TOYOTA JIDOSHA KABUSHIKI KAISHA, Toyota-shi, Aichi (JP)

(72) Inventors: Masahiro Hagi, Yokkaichi (JP); Hiroshi Inoue, Yokkaichi (JP); Kouki Shiga, Yokkaichi (JP); Hiroki Kawakami, Okazaki (JP)

(73) Assignees: SUMITOMO WIRING SYSTEMS, LTD., Mie (JP); TOYOTA JIDOSHA KABUSHIKI KAISHA, Toyota (JP)

( * ) Notice: Subject to any disclaimer, the term of this patent is extended or adjusted under 35 U.S.C. 154(b) by 0 days.

(21) Appl. No.: 15/756,533

(22) PCT Filed: Aug. 25, 2016

(86) PCT No.: PCT/JP2016/074766
§ 371 (c)(1),
(2) Date: Feb. 28, 2018

(87) PCT Pub. No.: WO2017/043323
PCT Pub. Date: Mar. 16, 2017

(65) Prior Publication Data
US 2018/0248345 A1 Aug. 30, 2018

(30) Foreign Application Priority Data

Sep. 11, 2015 (JP) .................................. 2015-179346

(51) Int. Cl.
*H01B 7/20* (2006.01)
*H02G 3/04* (2006.01)
(Continued)

(52) U.S. Cl.
CPC ....... *H02G 3/0462* (2013.01); *B60R 16/0222* (2013.01); *H01B 7/17* (2013.01);
(Continued)

(58) Field of Classification Search
USPC ........................................................ 174/74 R
See application file for complete search history.

(56) References Cited

U.S. PATENT DOCUMENTS

| 3,448,430 A | * | 6/1969 | Kelly | ....................... H01R 9/05 |
| | | | | 439/607.52 |
| 5,003,130 A | * | 3/1991 | Danforth | ................ H02G 3/083 |
| | | | | 174/153 G |

(Continued)

FOREIGN PATENT DOCUMENTS

| JP | H06-9016 U | 2/1994 |
| JP | H09-112754 A | 5/1997 |

(Continued)

OTHER PUBLICATIONS

Jan. 25, 2017 International Preliminary Report on Patentability in International Patent Application No. PCT/JP2016/074766.
(Continued)

*Primary Examiner* — William H. Mayo, III
*Assistant Examiner* — Krystal Robinson
(74) *Attorney, Agent, or Firm* — Oliff PLC

(57) ABSTRACT

A connecting end portion of a shield pipe with respect to a shield member is waterproofed. A shield conduction path includes: a shield pipe having a connecting end portion opened obliquely downward; a braided wire fasten to an outer periphery of the portion by a swaging ring; a plurality of wires inserted into the pipe and braided wire; a rubber shield grommet and surrounding a fastening region between the braided wire and swaging ring; a binding band that fixes an upper end portion of the grommet to an outer periphery (Continued)

of the pipe in a liquid tight manner; a tube formed of synthetic resin surrounding the braided wire and having an upper end portion surrounding a lower end of the grommet; and exterior adhesive tape wound in a liquid tight manner from an outer periphery of the upper end portion of the tube over an outer periphery of the grommet.

5 Claims, 6 Drawing Sheets

(51) Int. Cl.
*B60R 16/02* (2006.01)
*H01B 7/17* (2006.01)
*H05K 9/00* (2006.01)
*H02G 3/22* (2006.01)

(52) U.S. Cl.
CPC ......... *H05K 9/0073* (2013.01); *H05K 9/0098* (2013.01); *H02G 3/22* (2013.01)

(56) References Cited

U.S. PATENT DOCUMENTS

| | | | | |
|---|---|---|---|---|
| 5,635,678 | A * | 6/1997 | Yasukuni | H02G 3/088 156/48 |
| 5,904,584 | A * | 5/1999 | Flask | H01R 13/62927 439/157 |
| 6,627,817 | B1 * | 9/2003 | Kortenbach | H02G 3/083 174/541 |
| 8,460,015 | B2 * | 6/2013 | Deno | H01R 9/0518 174/78 |
| 2011/0155458 | A1 * | 6/2011 | Kato | B60R 16/0215 174/74 R |
| 2013/0248246 | A1 | 9/2013 | Oga | |
| 2013/0269981 | A1 * | 10/2013 | Shiga | B60R 16/0215 174/136 |
| 2015/0060134 | A1 * | 3/2015 | Minami | B60R 16/0222 174/72 A |
| 2015/0107894 | A1 | 4/2015 | Hayashi et al. | |

FOREIGN PATENT DOCUMENTS

| | | | |
|---|---|---|---|
| JP | 2006-311699 A | | 11/2006 |
| JP | 2006311699 A | * | 11/2006 |
| JP | 2007026821 A | * | 2/2007 |
| JP | 2012-125097 A | | 6/2012 |
| JP | 2012-222996 A | | 11/2012 |
| JP | 2015-042024 A | | 3/2015 |
| JP | 2015-080340 A | | 4/2015 |

OTHER PUBLICATIONS

Sep. 27, 2016 International Search Report issued in International Patent Application No. PCT/JP2016/074766.

\* cited by examiner

SHIELD CONDUCTION PATH

TECHNICAL FIELD

The present invention relates to a shield conduction path.

BACKGROUND ART

Patent Literature 1 discloses a shield conduction path that can be used for a hybrid vehicle or an electric vehicle. In this shield conduction path, a plurality of wires is inserted into a metal shield pipe, and at an outside of the shield pipe, a plurality of the wires is surrounded by a metal braided wire and the braided wire is surrounded by a cylindrical rubber member.

CITATIONS LIST

Patent Literature

Patent Literature 1: JP 2006-311699 A

SUMMARY OF INVENTION

Technical Problems

An end portion of the braided wire is swaged on an outer periphery of the shield pipe by using a metal swaging ring, and the end portion of the braided wire and the swaging ring are surrounded by the cylindrical rubber member. Further, an endmost portion of the cylindrical rubber member is caused to closely attach to the outer periphery of the shield pipe, whereby a swaged portion between the end portion of the braided wire and the swaging ring is waterproofed.

However, in the conventional shield conduction path, the end portion of the cylindrical rubber member is closely attached to the outer periphery of the shield pipe only elastically. Thus, there is a concern that water might enter from an outside through a gap of an closely attaching portion between the end portion of the cylindrical rubber member and the shield pipe, and the water that has entered might also enter an inside of the shield pipe along an outer peripheral surface of the shield pipe.

The present invention is completed based on the problem described above, and an object of the present invention is to waterproof a connecting end portion of a shield pipe with respect to a shield member.

Solutions to Problems

A shield conduction path of the present invention includes:

a shield pipe having one end portion formed as a connecting end portion, the connecting end portion being opened obliquely downward;

a shield member having a cylindrical shape and flexibility, the shield member being fasten to an outer periphery of the connecting end portion in a conductive manner by a swaging ring;

a plurality of wires inserted into the shield pipe and the shield member;

a shield grommet formed of rubber, the shield grommet being arranged so as to surround at least a fastening region between the shield member and the swaging ring;

a fixing member that fixes an upper end portion of the shield grommet to an outer periphery of the shield pipe in a liquid tight manner;

a tube having flexibility and formed of synthetic resin, the tube surrounding the shield member and being arranged such that an upper end portion of the tube surrounds at least a lower end portion of the shield grommet; and an adhesive tape wound in a liquid tight manner from an outer periphery of the upper end portion of the tube over an outer periphery of the shield grommet.

Advantageous Effects of Invention

Since water, which reaches an upper end of the shield grommet along the outer periphery of the shield pipe, flows on the outer periphery of the shield grommet, the outer periphery of the adhesive tape, and the outer periphery of the tube in this order, there is no risk that the connecting end portion of the shield pipe and the shield member are exposed to water. As a result, according to the present invention, the connecting end portion of the shield pipe with respect to the shield member can be waterproofed.

DESCRIPTION OF EMBODIMENTS

Figure 1:
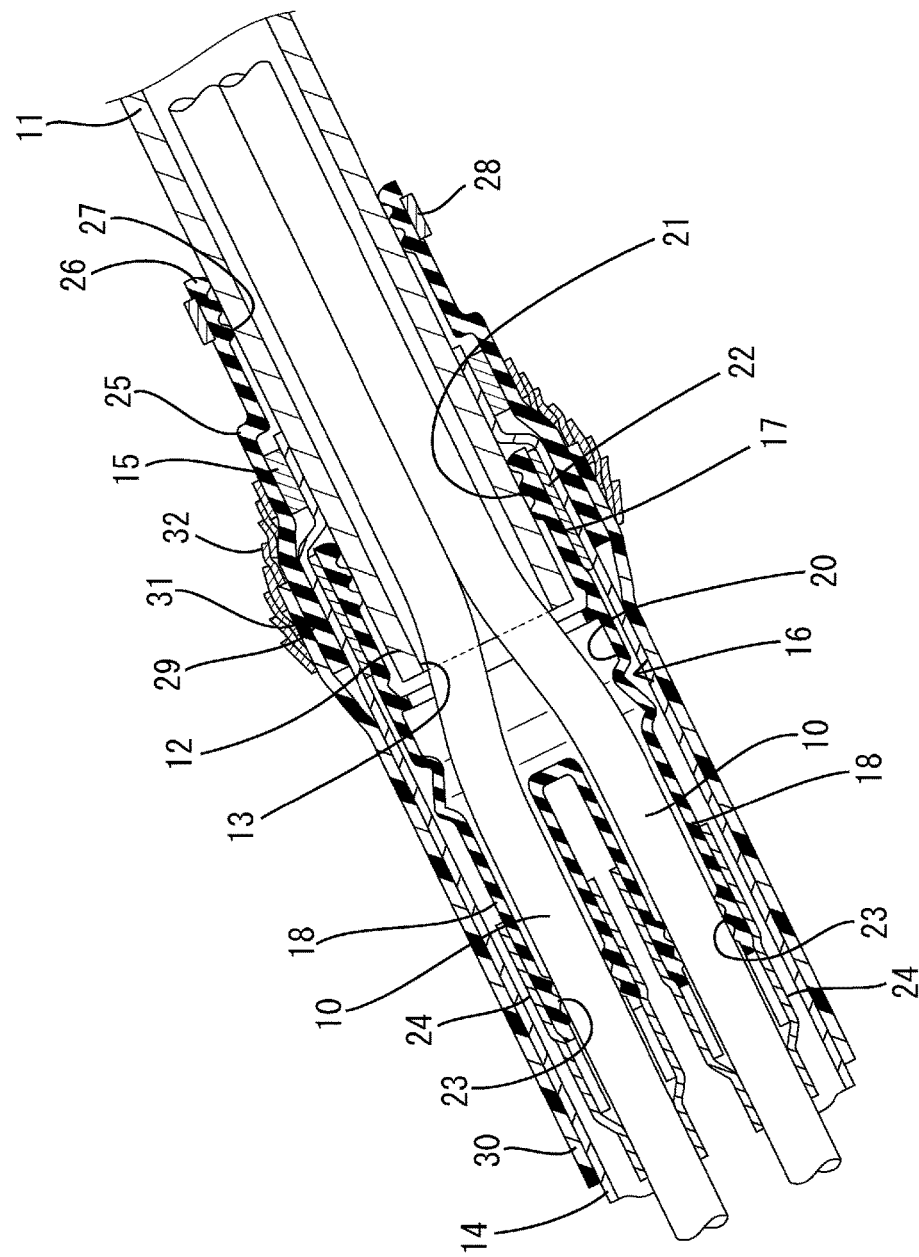
FIG. 1 is a side cross-sectional view of a shield conduction path according to Example 1.
Figure 2:
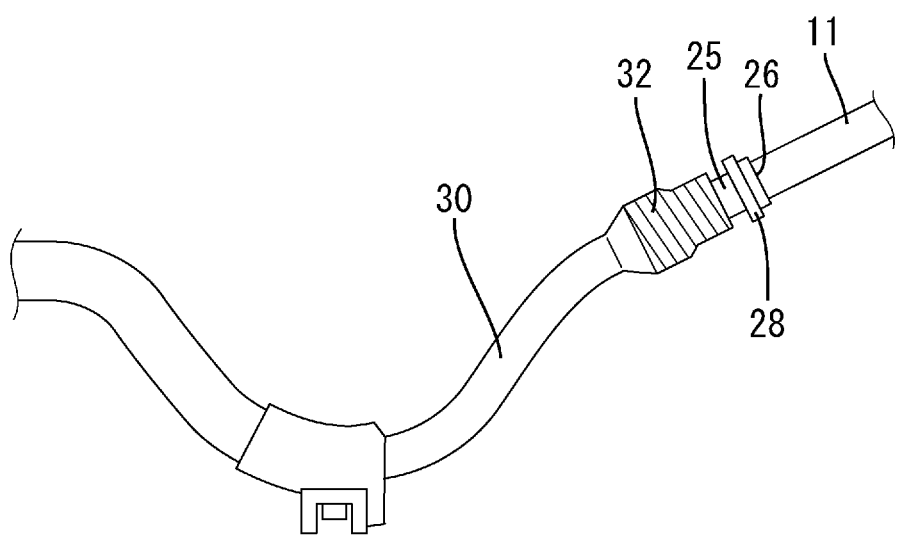
FIG. 2 is a side view illustrating an outer appearance of the shield conduction path.
Figure 3:
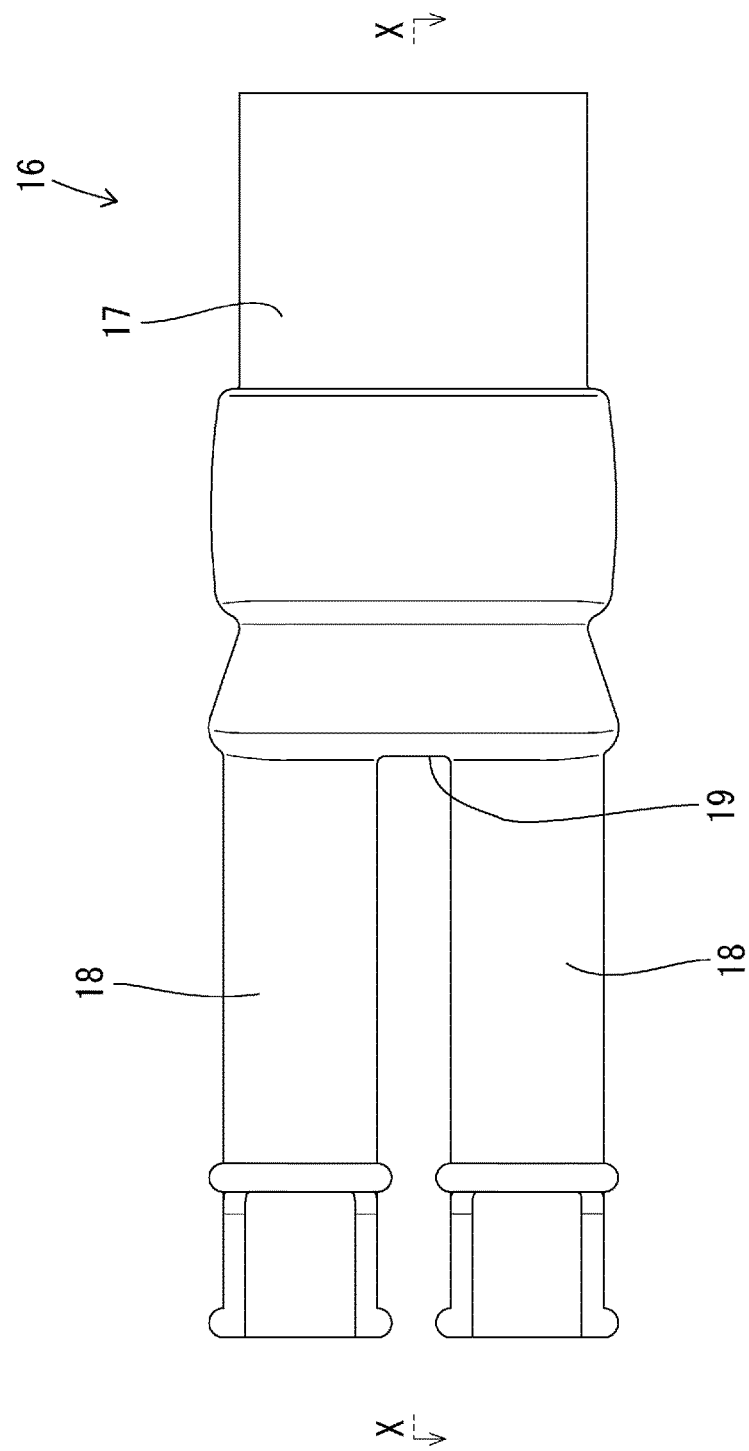
FIG. 3 is a side view of a pipe grommet.
Figure 4:
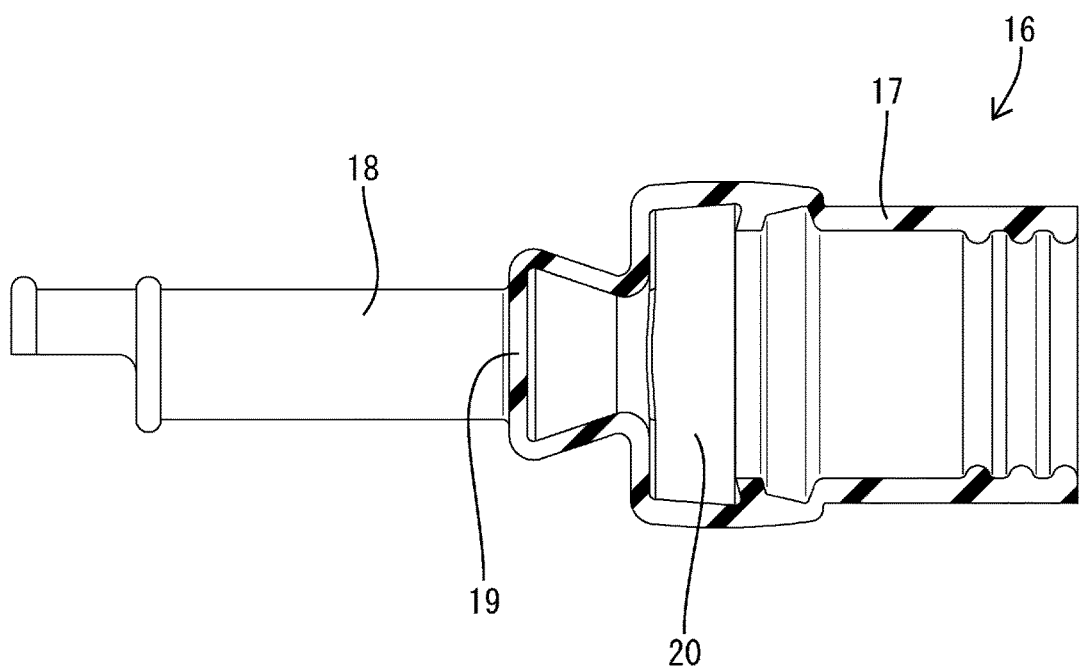
FIG. 4 is a cross-sectional view taken along line X-X in FIG. 3.
Figure 5:
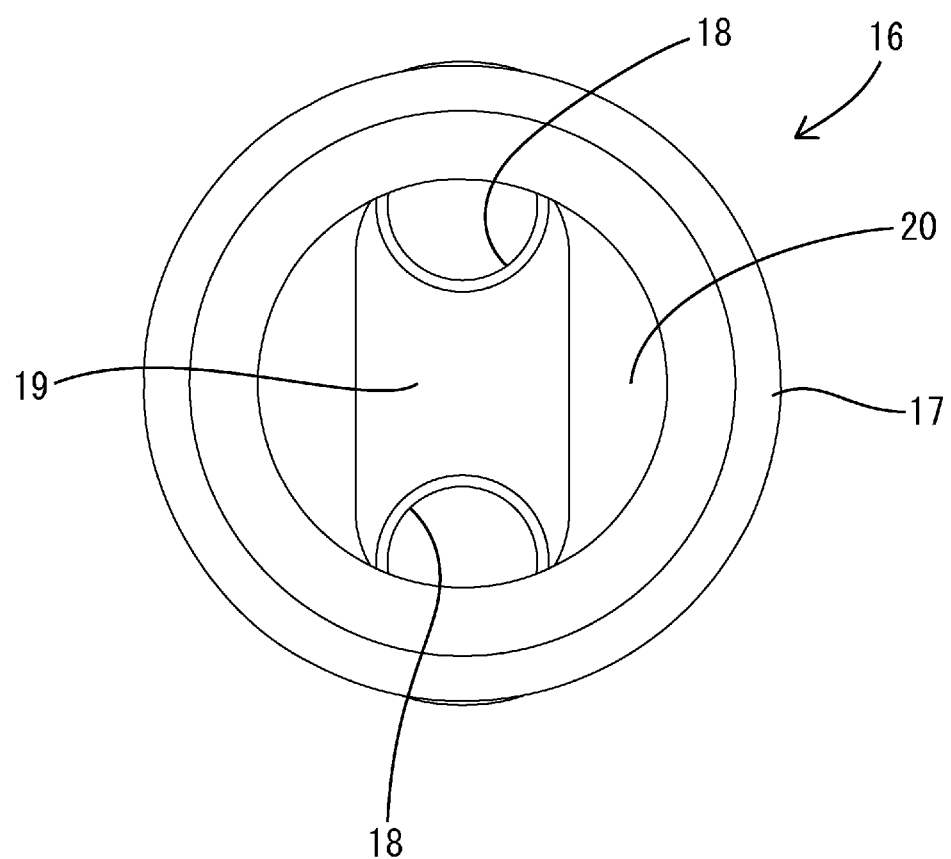
FIG. 5 is a front view of the pipe grommet.
Figure 6:
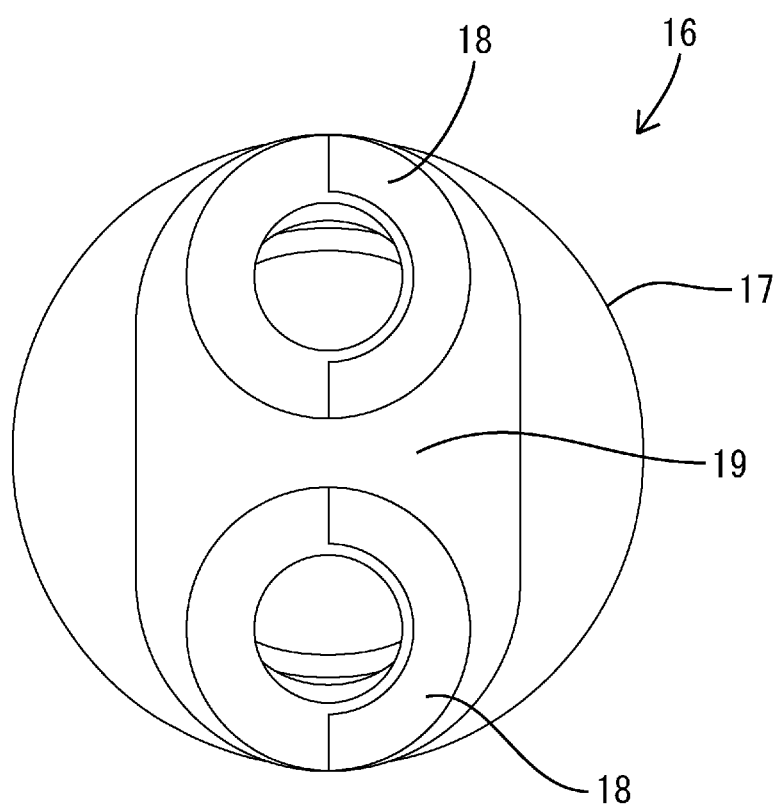
FIG. 6 is a rear view of the pipe grommet.

In the shield conduction path of the present invention, the adhesive tape may be wound downward from the shield grommet toward the tube in a spiral manner.

According to this configuration, in a case in which the shield conduction path is exposed to water from a lower side, the water can be prevented from entering a gap of the adhesive tape.

The shield conduction path of the present invention may include a pipe grommet formed with a wire sealing portion through which a plurality of wires is caused to penetrate individually in a liquid tight manner and formed with a pipe sealing portion that seals an opening of a lower end of the shield pipe in a liquid tight manner.

According to this configuration, even if water enters an inside of the tube at a lower side of the shield pipe, there is no risk that the water enters an inside of the shield pipe.

<Example 1>

Hereinafter, Example 1 embodying the present invention will be described with reference to FIGS. 1 to 6. A shield conduction path according to the present example includes two (a plurality of) wires 10, a shield pipe 11, a braided wire 14 (a shield member described in claims), a pipe grommet 16, a shield grommet 25, a tube 30, and an exterior adhesive tape 32 (an adhesive tape described in claims).

<Wire 10>

Each wire 10 is formed as a well-known conduction path in which a conductive body (not shown) is surrounded by an insulating coating. A sectional shape of the wire 10 is a circular shape. Two wires 10 are arranged, for example, between driving devices (not shown) such as a motor, an inverter and a battery installed on an electric vehicle (not shown) such as a hybrid car and an electric car.

<Shield Pipe 11>

The shield pipe 11 is formed by a pipe member formed of a metal material having a circular section and exerts a shield function. A bending process for forming a predetermined shape is applied to a necessary part of the shield pipe 11. The shield pipe 11 is arranged along a lower surface of a floor panel of the electric vehicle. One end portion of the shield pipe 11 is formed as a connecting end portion 12 to which a braided wire 14 is connected. As shown in FIG. 1, the shield pipe 11 is mounted to the electric vehicle such that an opening 13 of the connecting end portion 12 is opened obliquely downward and rearward.

<Braided Wire 14>

The braided wire 14 is formed by braiding a metal fine wire into a net shape to be a cylindrical shape having flexibility. Similarly to the shield pipe 11, the braided wire 14 exerts a shield function. One end portion of the braided wire 14 is arranged to cover an outer periphery of the connecting end portion 12 of the shield pipe 11 and is fasten to the outer periphery of the connecting end portion 12 in a conductive manner by a swaging ring 15 formed of metal. The braided wire 14 is extended obliquely downward and rearward from the connecting end portion 12 of the shield pipe 11. The two wires 10 described above are inserted inside of the braided wire 14 and the shield pipe 11.

<Pipe Grommet 16>

The pipe grommet 16 is formed of rubber. As shown in FIGS. 3 to 6, the pipe grommet 16 includes one pipe sealing portion 17 formed in a cylindrical shape, a pair of wire sealing portions 18 formed in a substantially cylindrical shape. A rear end portion of the pipe sealing portion 17 is connected to front end portions of the paired wire sealing portions 18 arranged in parallel via a connection portion 19 formed in a wall shape substantially orthogonal to an axial line of the pipe sealing portion 17. An inner space of the pipe sealing portion 17 and inner spaces of the pair of wire sealing portions 18 formed in a bifurcated shape form a sealing space 20 communicating with both of the inner spaces. The sealing space 20 communicates with an outside of the pipe grommet 16 only at a front end surface of the pipe sealing portion 17 and at rear end portions of the respective wire sealing portions 18.

As shown in FIG. 1, the two wires 10 are arranged in parallel in the pipe sealing portion 17 to penetrate therethrough. Further, each of the wires 10 penetrates each of the wire sealing portions 18 individually. Further, the pipe grommet 16 is mounted to the shield pipe 11 such that the front end portion of the pipe sealing portion 17 covers the outer periphery of the connecting end portion 12 of the shield pipe 11. A mounting position of the pipe sealing portion 17 in the connecting end portion 12 is a region lower than a position where the braided wire 14 is fasten by the swaging ring 15 (a region closer to the opening 13 of the shield pipe 11). The pipe grommet 16 mounted to the shield pipe 11 is extended obliquely downward and rearward from the connecting end portion 12 of the shield pipe 11.

An inner periphery of the front end portion of the pipe sealing portion 17 fitted onto the connecting end portion 12 is formed with a pipe side rip portion 21 extending along a circumferential direction. Further, a pipe sealing adhesive tape 22 is firmly wound on an outer periphery of the front end portion of the pipe sealing portion 17. The pipe side rip portion 21 is closely attached to the outer periphery of the connecting end portion 12 in a liquid tight manner while being elastically deformed by the winding of the pipe sealing adhesive tape 22. With this, a gap between an inner periphery of the front end portion (upper end portion) of the pipe grommet 16 and an outer periphery of the shield pipe 11 is sealed, and therefore water is prevented from entering the sealing space 20 through this gap.

Further, an inner periphery of the rear end portion of each of the wire sealing portions 18 is formed with a wire side rip portion 23 extending along a circumferential direction. Further, the wire sealing adhesive tape 24 is firmly wound from the outer periphery of the rear end portion of the wire sealing portion 18 fitted onto the wire 10 over an outer periphery of a region of the wire 10 extended obliquely downward from the wire sealing portion 18. The wire side rip portion 23 is closely attached to the outer periphery of the wire 10 in a liquid tight manner while being elastically deformed by the winding of the wire sealing adhesive tape 24. With this, a gap between an inner periphery of the rear end portion (lower end portion) of the pipe grommet 16 (the wire sealing portion 18) and the outer periphery of the wire 10 is sealed, and therefore water is prevented from entering the sealing space 20 through this gap.

As described above, the opening 13 of the connecting end portion 12 of the shield pipe 11 is sealed in a liquid tight manner by the pipe grommet 16, the opening 13 being opened obliquely downward. With this, water is prevented from entering the inside of the shield pipe 11 from the opening 13 of the connecting end portion 12. Further, the pipe grommet 16, the pipe sealing adhesive tape 22 and the wire sealing adhesive tape 24 are surrounded by the braided wire 14.

<Shield Grommet 25>

The shield grommet 25 is formed of rubber and formed in an elastically deformable cylindrical shape. The shield grommet 25 is mounted so as to surround the shield pipe 11. An upper end portion 26 of the shield grommet 25 is disposed at a position slightly upper than the fastening region between the braided wire 14 and the swaging ring 15. A plurality of pipe rip portions 27 extending along the circumferential direction is protrudingly formed on an inner periphery of the upper end portion 26 of the shield grommet 25. The pipe rip portions 27 are in a direct contact with the outer periphery of the connecting end portion 12 of the shield pipe 11.

Further, the upper end portion of the shield grommet 25 is firmly fastened by a binding band 28 (a fixing member described in claims). The pipe rip portion 27 is closely attached to an outer peripheral surface of the shield pipe 11 in a liquid tight manner by the fastening of the binding band 28. With this, a gap between an inner periphery of the shield grommet 25 and an outer periphery of the shield pipe 11 is sealed, and therefore water is prevented from entering the shield grommet 25 through this gap.

The shield grommet 25 surrounds the fastening region between the braided wire 14 and the swaging ring 15. Further, a lower end portion 29 of the shield grommet 25 is located at a region corresponding to the upper end portion (front end portion) of the pipe grommet 16 in an axial line direction of the shield pipe 11 so as to surround the upper end portion of the pipe sealing portion 17 and the braided wire 14. Further, an inner periphery of the lower end portion 29 of the shield grommet 25 is in contact with the outer periphery of the braided wire 14.

<Tube 30>

The tube 30 is formed of synthetic resin and formed in a cylindrical shape having flexibility. The tube 30 is mounted so as to surround the braided wire 14. An upper end portion 31 of the tube 30 is arranged to cover an outer periphery of the lower end portion 29 of the shield grommet 25.

<Exterior Adhesive Tape 32>

The exterior adhesive tape 32 is wound from the outer periphery of the shield grommet 25 upper than the tube 30 over an outer periphery of the upper end portion 31 of the tube 30 so as to fasten these outer peripheries. A gap between an inner periphery of the upper end portion 31 of the tube 30 and an outer periphery of the lower end portion 29 of the shield grommet 25 is sealed in a liquid tight manner by the fastening of the exterior adhesive tape 32. With this, water is prevented from entering an inside of the tube 30 through this gap.

Further, a winding end of the exterior adhesive tape 32 is closely attached to the outer periphery of the shield grommet 25. Further, the exterior adhesive tape 32 is wound downward in a spiral manner. That is, when winding the exterior adhesive tape 32, a later wound region is overlapped on an outer periphery of a lower end portion of a former wound region. Accordingly, in a case in which water reaches the outer periphery of the exterior adhesive tape 32 from an obliquely lower side, the water flows along an outer peripheral surface of the exterior adhesive tape 32 without entering a gap between the exterior adhesive tapes 32.

<Functions and Effects of Example>

The shield conduction path of the present example includes the shield pipe 11, the braided wire 14, the two (a plurality of) wires 10, the shield grommet 25, the binding band 28, the tube 30, and the exterior adhesive tape 32. The shield pipe 11 has one end portion formed as the connecting end portion 12 and the connecting end portion 12 is opened obliquely downward. The braided wire 14 is a member having a cylindrical shape and flexibility and is fasten to the outer periphery of the connecting end portion 12 in a conductive manner by the swaging ring 15. The wire 10 is inserted into the shield pipe 11 and the braided wire 14. The shield grommet 25 is a member formed of rubber and arranged so as to surround at least the fastening region between the braided wire 14 and the swaging ring 15.

The binding band 28 fixes the upper end portion 26 of the shield grommet 25 to the outer periphery of the shield pipe 11 (the connecting end potion 12) in a liquid tight manner. The tube 30 is a member having flexibility and formed of synthetic resin and surrounds the shield member. The upper end portion of the tube 30 surrounds at least the lower end portion of the shield grommet 25. The exterior adhesive tape 32 is wound in a liquid tight manner from the outer periphery of the upper end portion 31 of the tube 30 over the outer periphery of the shield grommet 25.

According to the shield conduction path having such a configuration, since water, which reaches an upper end of the shield grommet 25 along the outer periphery of the shield pipe 11, flows downward on the outer periphery of the shield grommet 25, the outer periphery of the exterior adhesive tape 32, and the outer periphery of the tube 30 in this order, there is no risk that the connecting end portion 12 of the shield pipe 11 and the shield member are exposed to water. As a result, the connecting end portion 12 of the shield pipe 11 to the shield member can be waterproofed securely.

Further, the exterior adhesive tape 32 is wound downward from the shield grommet 25 toward the tube 30 in a spiral manner. According to this configuration, in a case in which the shield conduction path is exposed to water from a lower side, the water can be prevented from entering a gap between the adhesive tapes 32.

Further, the shield conduction path of the present example includes a pipe grommet 16 formed with a wire sealing portion 18 through which the two wires 10 are caused to penetrate individually in a liquid tight manner and formed with a pipe sealing portion 17 that seals the opening 13 of a lower end of the shield pipe 11 in a liquid tight manner. By arranging the pipe grommet 16, even if water enters the inside of the tube 30 at a lower side of the shield pipe 11 and the water reaches near the opening 13 of the lower end portion of the shield pipe 11, there is no risk that the water enters the inside of the shield pipe 11.

<Other Examples>

The present invention is not limited to the example described with reference to the above descriptions and drawings, but the following examples are also encompassed by the scope of the present invention, for example.

(1) In the example described above, the exterior adhesive tape is wound downward in a spiral manner; however, in a case in which the shield conductive path is exposed to water from an upper side, the exterior adhesive tape may be wound upward in a spiral manner.

(2) In the example described above, the braided wire formed by braiding a metal fine wire into a net shape is used as the shield member; however, the shield member is not limited to the braided wire, but a metal foil, or a member in which a conductive layer is laminated on an outer peripheral surface of a non-conductive base material may be used.

(3) In the example described above, the opening of the lower end of the shield pipe is sealed by the pipe grommet in a liquid tight manner; however, the opening of the lower end of the shield pipe may not be sealed by the pipe grommet.

(4) In the example described above, the two wires are inserted into the shield pipe and the shield member; however, three or more wires may be inserted into the shield pipe and the shield member.

(5) In the example described above, the pipe sealing adhesive tape is wound only on the outer periphery of the pipe sealing portion; however, the pipe sealing adhesive tape may be wound from the outer periphery of the pipe sealing portion over the outer periphery of the shield pipe.

(6) In the example described above, the wire sealing adhesive tape is wound from the outer periphery of the wire sealing portion over the outer periphery of the wire; however, the wire sealing adhesive tape may be wound only on the outer periphery of the wire sealing portion.

(7) In the example described above, the binding band is used as the fixing member for fixing the shield grommet to the shield pipe; however, a member (for example, an adhesive tape) other than the binding band may be used as the fixing member.

REFERENCE SIGNS LIST

10: wire
11: shield pipe
12: Connecting end portion
13: opening of the shield pipe
14: braided wire (shield member)
15: swaging ring
16: pipe grommet
17: pipe sealing portion
18: wire sealing portion
25: shield grommet
26: upper end portion of the shield grommet
28: binding band (fixing member)
29: lower end portion of the shield grommet
30: tube
31: upper end portion of tube
32: exterior adhesive tape (adhesive tape)

The invention claimed is:

1. A shield conduction path comprising:
a shield pipe having one end portion formed as a connecting end portion, the connecting end portion being opened obliquely downward;
a shield member having a cylindrical shape and flexibility, the shield member being fasten to an outer periphery of the connecting end portion in a conductive manner by a swaging ring;
a plurality of wires inserted into the shield pipe and the shield member;
a shield grommet formed of rubber, the shield grommet being arranged so as to surround at least a fastening region between the shield member and the swaging ring;
a fixing member that fixes an upper end portion of the shield grommet to an outer periphery of the shield pipe in a liquid tight manner;
a tube having flexibility and formed of synthetic resin, the tube surrounding the shield member and being arranged such that an upper end portion of the tube surrounds at least a lower end portion of the shield grommet; and
an adhesive tape wound in a liquid tight manner from an outer periphery of the upper end portion of the tube over an outer periphery of the shield grommet.

2. The shield conduction path according to claim 1, wherein the adhesive tape is wound downward from the shield grommet toward the tube in a spiral manner.

3. The shield conduction path according to claim 2, further comprising a pipe grommet formed with a wire sealing portion through which the wires are caused to penetrate individually in a liquid tight manner and formed with a pipe sealing portion that seals an opening of a lower end of the shield pipe in a liquid tight manner.

4. The shield conduction path according to claim 1, further comprising a pipe grommet formed with a wire sealing portion through which the wires are caused to penetrate individually in a liquid tight manner and formed with a pipe sealing portion that seals an opening of a lower end of the shield pipe in a liquid tight manner.

5. The shield conduction path according to claim 1, wherein the lower end portion of the shield grommet is located at a height position corresponding to the connecting end portion of the shield pipe in an axial line direction of the shield pipe.

* * * * *